US009410539B2

(12) United States Patent
Manzoni

(10) Patent No.: US 9,410,539 B2
(45) Date of Patent: Aug. 9, 2016

(54) MICRO-NOZZLE THRUSTER

(75) Inventor: Giulio Manzoni, Singapore (SG)

(73) Assignee: MICROSPACE RAPID PTE LTD, Singapore (SG)

( * ) Notice: Subject to any disclaimer, the term of this patent is extended or adjusted under 35 U.S.C. 154(b) by 954 days.

(21) Appl. No.: 13/577,657

(22) PCT Filed: Feb. 8, 2011

(86) PCT No.: PCT/SG2011/000055
§ 371 (c)(1),
(2), (4) Date: Aug. 7, 2012

(87) PCT Pub. No.: WO2011/096899
PCT Pub. Date: Aug. 11, 2011

(65) Prior Publication Data
US 2012/0318886 A1 Dec. 20, 2012

(30) Foreign Application Priority Data

Feb. 8, 2010 (SG) .............................. 201000910-8

(51) Int. Cl.
*B64G 1/40* (2006.01)
*F03H 1/00* (2006.01)
*H05H 1/50* (2006.01)
*H05H 1/54* (2006.01)

(52) U.S. Cl.
CPC ............... *F03H 1/0037* (2013.01); *B64G 1/40* (2013.01); *B64G 1/405* (2013.01); *B64G 1/406* (2013.01); *F03H 1/00* (2013.01); *F03H 1/0043* (2013.01); *F03H 1/0056* (2013.01); *F03H 1/0081* (2013.01); *F03H 1/0087* (2013.01); *F03H 1/0093* (2013.01); *H05H 1/50* (2013.01); *H05H 1/54* (2013.01)

(58) Field of Classification Search
CPC ...... B64G 1/405; B64G 1/406; F03H 1/0037; F03H 1/0043; F03H 1/0056; F03H 1/0081; F03H 1/0087; F03H 1/0093
See application file for complete search history.

(56) References Cited

U.S. PATENT DOCUMENTS

| 3,537,266 A | * | 11/1970 | Magnuson | ............ F03H 1/0043 313/362.1 |
| 4,209,703 A | * | 6/1980 | Delcroix | ............... F03H 1/0056 250/423 R |
| 4,548,033 A | * | 10/1985 | Cann | ...................... B64G 1/406 313/231.41 |
| 4,577,461 A | * | 3/1986 | Cann | ............................ 60/203.1 |
| 4,577,462 A | * | 3/1986 | Robertson | ............... F02K 1/386 181/220 |

(Continued)

FOREIGN PATENT DOCUMENTS

WO 00/58989 10/2000

OTHER PUBLICATIONS

ISR and WO for PCT/SG2011/000055 completed on May 16, 2011 and May 9, 2011.

Primary Examiner — Phutthiwat Wongwian
Assistant Examiner — William Breazeal
(74) Attorney, Agent, or Firm — Ladas & Parry, LLP

(57) ABSTRACT

A micro-nozzle thruster comprising a micro-nozzle having an inlet at a first end perpendicularly aligned gas supply channel at a first end, and a thruster outlet at a second opposed end; said inlet in fluid communication with a gas supply channel, said gas supply channel perpendicularly aligned with a longitudinal axis of the micro-nozzle; a cathode within the gas supply channel and an anode external to the gas supply channel and proximate to the inlet, so as to create a plasma flow from said gas.

16 Claims, 15 Drawing Sheets

(56) References Cited

U.S. PATENT DOCUMENTS

| | | | | |
|---|---|---|---|---|
| 4,733,530 A | * | 3/1988 | Beattie | F03H 1/0012 315/111.21 |
| 4,800,716 A | * | 1/1989 | Smith | B64G 1/406 219/121.57 |
| 5,076,051 A | * | 12/1991 | Naff | B64G 1/406 219/121.51 |
| 5,319,926 A | * | 6/1994 | Steenborg | B64G 1/406 60/203.1 |
| 5,826,150 A | * | 10/1998 | Folkins | G03G 15/0126 399/256 |
| 5,836,150 A | * | 11/1998 | Garcia | 60/256 |
| 6,216,445 B1 | | 4/2001 | Byers et al. | |
| 2003/0033797 A1 | | 2/2003 | Spanjers et al. | |
| 2005/0217238 A1 | | 10/2005 | Land et al. | |
| 2007/0164680 A1 | * | 7/2007 | Kumar | B01D 53/92 315/111.21 |
| 2009/0120056 A1 | * | 5/2009 | Friedberger et al. | 60/203.1 |
| 2010/0058734 A1 | * | 3/2010 | Stein et al. | 60/203.1 |
| 2013/0067833 A1 | * | 3/2013 | Aguera Riquelme | E04B 2/7457 52/127.8 |

\* cited by examiner

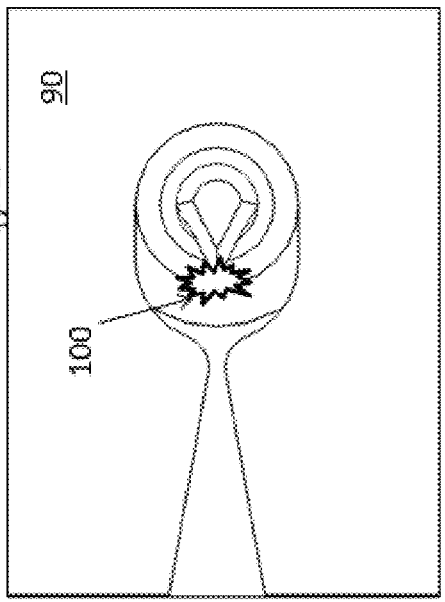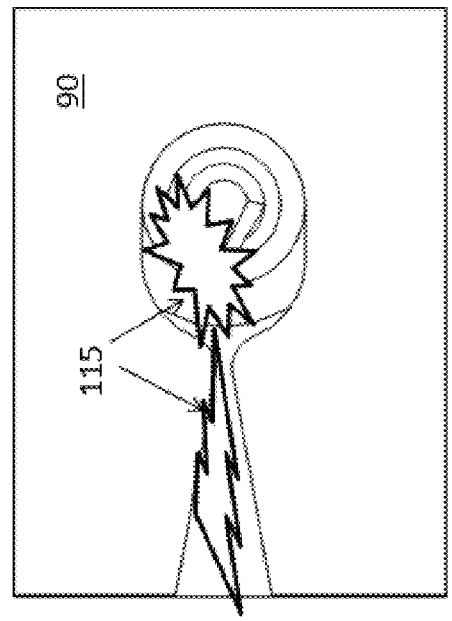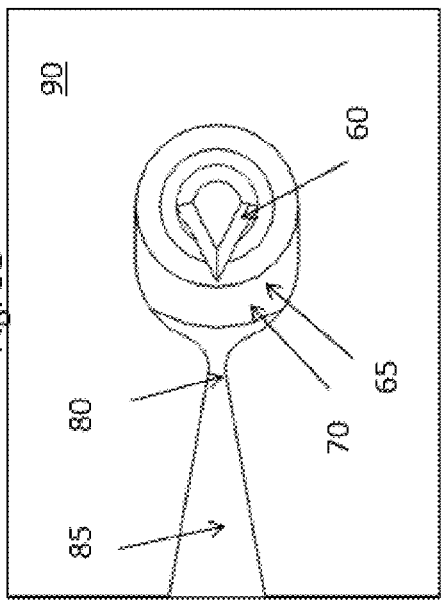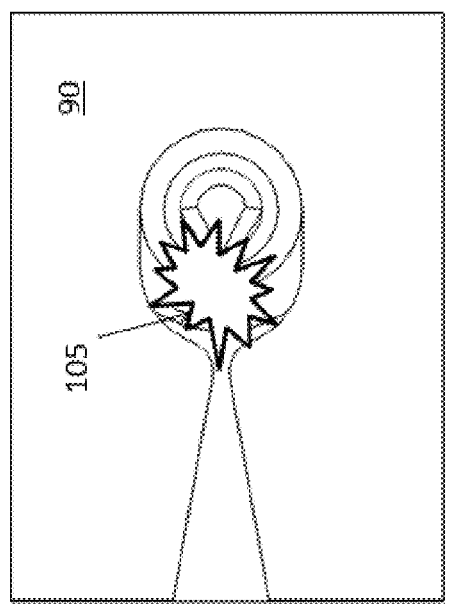

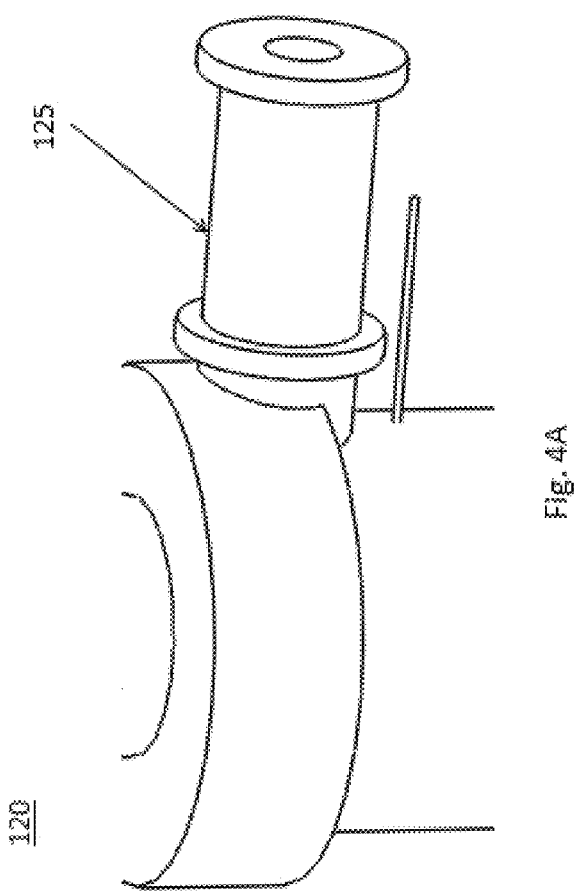

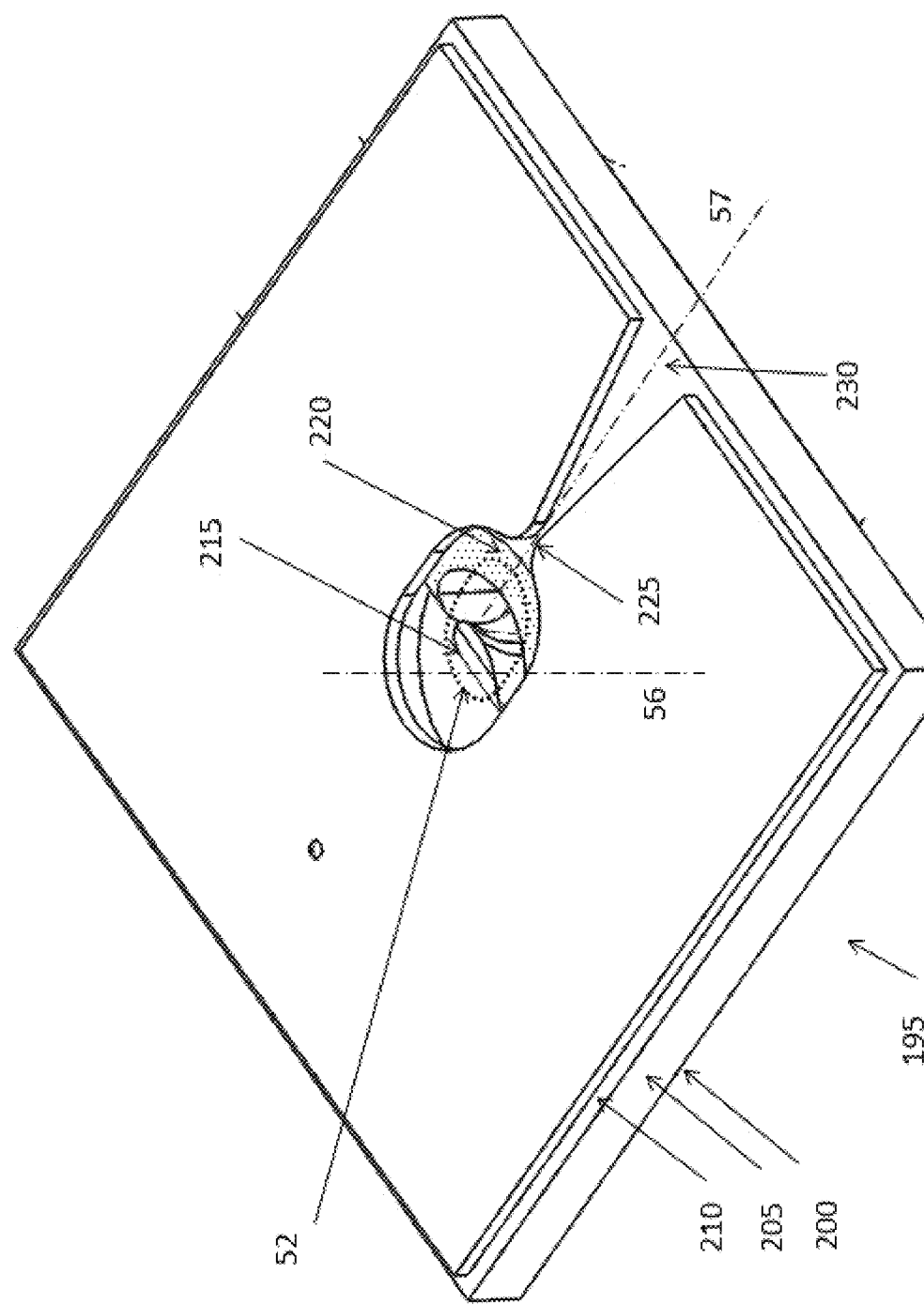

MICRO-NOZZLE THRUSTER

FIELD OF THE INVENTION

The invention relates to micro- and nano-satellites, and in particular, thrusters for the maneuvering of said satellites.

BACKGROUND

Satellites and spacecrafts miniaturization is a recognized trend covering the whole range of space missions from simple university missions designed by students to sophisticated military satellites and interplanetary probes. The rationale for miniaturization comes from the drastic launch and manufacturing cost reductions in combination with the growing offer and availability of new miniaturized parts, subsystems and satellite buses.

Besides such scientific missions, the first obvious tasks for micro and nano-satellites are Earth observation for environmental, military and geological uses, while telecommunications will follow as soon as the other technological building blocks will be available. Last but not least, missions related to entertainment and space tourism will become common as soon as rocket plane launches will be offered on regular basis.

In fact, the so called "New Space" movement will be finally able to solve the major obstacle to the diffusion of small satellites: the launch. Until now, launches are always arranged in piggyback fashion whereby the largest cost of the launch is paid by a very big satellite and the nano or micro-satellite are taken in an orbit and with a schedule which are not necessarily the optimal for their needs and interests. The space tourism technologies developed by the "New Space" entrepreneurs will enable weekly or daily regular launches from Spaceports distributed all over the world. In this way the full potential of micro and nano-satellites will be finally available possibly having extremely short time missions, launched on demand and with hardware of very low cost.

The usual definition of satellite sizes classifies Microsatellites between 10 kg and 100 kg, Nano-satellites between 1 kg and 10 kg and Pico-satellites below 1 kg.

Among the nano-satellites the Cubesat ranges from 1 kg to 3 kg with a nominal cross section of 100 mm×100 mm and nominal length between 50 mm and 350 mm. This standard, introduced by Stanford University and California Polytechnic is extremely important because of the use of a standardized deployment system called P-Pod (5) which completely de-couples the integration of the nano-satellites from the rocket vehicle making very simple the launching of a nano-satellite even for a small university team. All rocket interface issues are taken care by the P-Pod standard deployment system. Various commercial ventures are even promoting satellites of 750 g, of cylindrical shape, called "Tubesats", for US$ 8000 launch included on very Low Earth Orbit (LEO) with the first launch scheduled for 2011.

One of the improvements long waited for will be the advent of really miniaturized and efficient propulsion systems which in combination with other subsystems miniaturization efforts will allow the use of micro and nano-satellites for comparable to the more conventional and larger spacecrafts ones.

A challenge for achieving a small thrust is to do it efficiently in order to have the best use of the limited amount of propellant available on board This as well as thrusters efficiencies have to cope with the mission requirements of spacecraft velocity change $\Delta V$.

Generally speaking a list of typical manoeuvres with an indication of $\Delta V$ ranges from is:

Transfer to planetary trajectory (3600 to 4000 m/s)
Orbit transfer to GEO (~4000 m/s)
Plane change (100-1000 m/s)
Orbit rising, drag make-up, controlled re-entry (50~1500 m/s)
Orbit maintenance and attitude control (10-100 m/s per year)
Relative motion of spacecrafts (1-100 m/s per manoeuvre)

To this end, for a nano-satellite, the standard design performance expected may fall within the following parameters:
Thrust between 500 $\mu$N and 500 mN;
Minimum $\Delta V$ 10 m/s;
Average $\Delta V$ 100 m/s (includes orbit injection correction, acquisition and maintenance), up to 200 m/s if including de-orbiting;
Maximum $\Delta V$ 2000 m/s (including Moon, transfers or orbit changes);
Dry mass budget 1 kg (possibly 400 g);
Propellant mass budget 3 kg;
Tank size max 200 mm diameter;
Power budget, max 10 W, average 2~3 W;
1 DoF for high $\Delta V$, 3 DoF for low AA, 6 DoF for moderate $\Delta V$, $\mu$N for attitude control.

Since low thrust propulsion systems have become available few decades ago, we have learned how to benefit from continuous-thrust manoeuvres instead of impulsive manoeuvres. This is going to be even more important for nano and micro-satellites which necessarily have extremely low power availability and small mass budget for propellant storage, requiring high specific impulse engines working at low thrust for long time.

The selection of a propulsion technology for a given spacecraft and mission requires consideration of the whole system whereby the engine is accompanied by a reservoir or tank and a power supply which includes batteries and solar cells.

Propulsion systems include the five main groups of elements: mass storage and supply, electric storage and supply, thermodynamic acceleration of the propellant, propellant ionization, propellant electrical acceleration. The various combination of such elements create the different propulsion system which all have the common goal to produce the highest possible momentum of the ejected propellant with the smallest possible use of propellant mass and electric power.

Chemical propulsion systems derive their energy from the chemical energy content of the propellant which is endo-thermically heated or, in addition to it electro-thermally heated, leading to the achievement of propellant exit velocity which depends on the achievable propellant temperature (24).

$$= \sqrt{\frac{2\gamma}{\gamma-1}} \Gamma C^* \left[1 - \left(\frac{P_s}{P_c}\right)^{\frac{\gamma-1}{\gamma}}\right]^{\frac{1}{2}}$$

$$= \left(\frac{\gamma+1}{2}\right)^{(\gamma+1)/(\gamma-1)} \sqrt{\frac{RT_t^*}{\gamma}}$$

The temperature achievable by the propellant is ultimately limited by the combustion chamber and expansion nozzles materials giving a practical limitation to the specific impulse of chemical propulsion systems.

Propulsion systems will soon enable very advanced small satellite missions including constellation and formation flight with distributed sensors, communication networking, assembly of larger structures in Space, maintenance of larger spacecrafts, de-orbiting, Moon exploration and others. While many laboratories worldwide are studying and prototyping systems based on various principles, there are very few examples of micro and nano-satellites carrying a. micro-propulsion unit. Furthermore, such units are generally limited to a micro-propulsion payload and do not perform a primary mission requirement. This is clearly due to the modest performances of the systems available to create a new micro-propulsion system really miniaturized in all its components providing sufficient Thrust, Specific Impulse and Efficient use of the limited available power and storage volume and mass budget.

SUMMARY OF INVENTION

In a first exemplary technique, there is provided a micro-nozzle thruster comprising a micro-nozzle having an inlet at a first end perpendicularly aligned gas supply channel at a first end, and a thruster outlet at a second opposed end; said inlet in fluid communication with a gas supply channel, said gas supply channel perpendicularly aligned with a longitudinal axis of the micro-nozzle; a cathode within the gas supply channel and an anode external to the gas supply channel and proximate to the inlet, so as to create a plasma flow from said gas.

In a second exemplary technique, there is provided a micro-nozzle thruster comprising a micro-nozzle having an inlet at a first end co-axially aligned gas supply channel at a first end, and a thruster outlet at a second opposed end; said inlet in fluid communication with a gas supply channel, said gas supply channel perpendicularly aligned with a longitudinal axis of the micro-nozzle; a cathode within the gas supply channel and an anode external to the gas supply channel and proximate to the inlet, so as to create a plasma flow from said gas.

In a third exemplary technique, there is provided a method of propulsion comprising the steps of: supplying a gas along a channel; passing said gas across a cathode and an anode so as to create a plasma stream; directing said plasma stream along a nozzle perpendicular to the channel, and; ejecting said plasma from an outlet of said nozzle.

In contrast to chemical propulsion, there is no material temperature limitation to the speed of ions leaving an electric propulsion rocket and therefore very high specific impulses can be obtained. This makes electric propulsion interesting for very high $\Delta Y$ requirements thanks to the reduced amount of propellant that needs to be stored.

It is the low thrust and high specific impulse that makes the electrical propulsion interesting for long duration non impulsive manoeuvres.

In one embodiment of the invention, the thruster may include a resistor 61 to pre-heat the gas reaching the nozzle or to vaporize a liquid before it reaches the nozzle (resistojet preheating). Further, a resistor may be used to pre-heat the cathode thereby enhancing the release of electrons by thermionic emission (cathode emitter). Resistor 61 can also be used for preheating the cathode.

In a further embodiment, heat lost through the nozzle walls may be regenerated to pre-heat the gas flowing to the nozzle (regenerative nozzle).

In a further embodiment, a magnetic field inside the nozzle may be produced by permanent magnets or coils placed outside the nozzle, to create a magnetic confinement of the plasma in the central portion of the nozzle thereby reducing wall heat losses. In the case of the nozzle having a prismatic structure, the nozzle may be inserted in the gap of a magnetic circuit. Such an arrangement may have minimal losses of magnetic flux (magneto hydrodynamic confinement).

In a further embodiment, a combination of magnetic fields and electric fields transversally to the nozzle may create a force that confines and accelerates the plasma through the nozzle.

Again, in the case of a prismatic structure of the micro-fabricated nozzle, such electric fields may be achieved by deposition of electrodes on faces of the nozzle (magneto hydrodynamic thruster).

In a further embodiment, magnetic fields may be added inside the nozzle to separate different ionized species and drive them to different exits areas or to multiple nozzles by exploiting the different ratio between mass and electric charge resulting in different radius of the path produced by the magnetic fields (magneto hydrodynamic distillation).

In a further embodiment, a mix of gases or gases and liquids or gases and solid particles may be injected through a particle supply 62 to facilitate ionization, to increase the momentum of the ejected material or to produce a thermal or deposition coating effect to materials placed in the ejected stream (plasma torch).

In a further embodiment, the thruster according to the present invention may be a basic cold gas micro-thruster. Alternatively, it may be a Resistojet/Arcjet. Further still, it may be a Resistojet-Mixer/Bipropellant The efficiency of propellant use in thrusters may depend on the temperature of the gas supplied before the expansion nozzle. Such temperature corresponds to the energy content of the gas per unit of mass and such energy is converted in speed during the gas expansion along the convergent-divergent shape of the nozzle. Higher temperature means higher energy and therefore higher speed or momentum transferred from the gas leaving the nozzle to the nozzle itself thereby creating the aimed propulsive effect. The gas is stored or provided at a certain temperature compatible with the storage materials and technologies and there may be additional energy available in other forms, usually electricity that can be transferred to the gas just before the nozzle to raise the gas temperature and therefore the thruster efficiency.

The more intimate such transfer can be achieved inside the gas, the less energy will be lost to the nozzle walls. One of the best ways to provide such energy is by creating a current through the gas in form of a spark, a discharge arc or plasma. The core of the arc can be sufficiently far from the nozzle walls to minimize the thermal losses and maximize the transfer to the gas reaching temperatures between 5000K and 10000K or more without damage to the nozzle walls.

This is usually achieved in so-called Arcjet thrusters where a cathode is inserted in proximity of the nozzle throat that is electrically connected as anode. The high voltage difference between cathode and anode produces the arc discharge in the gas and therefore heats up the gas flowing through it.

BASIC DESCRIPTION OF DRAWINGS

It will be convenient to further describe the present invention with respect to the accompanying drawings that illustrate possible arrangements of the invention. Other arrangements of the invention are possible, and consequently the particularity of the accompanying drawings is not to be understood as superseding the generality of the preceding description of the invention.

FIGS. 3A to 3D and FIGS. 3E to 3H are sequential views of the micro-nozzle thruster according to FIGS. 2A and 2B;

FIGS. 4A and 4B are elevation views of the micro-nozzle thruster according to a further embodiment of the present invention;

FIGS. 5A and 5B are isometric views of a micro-nozzle thruster according to a further embodiment of the present invention;

DETAILED DESCRIPTION

Figure 1:
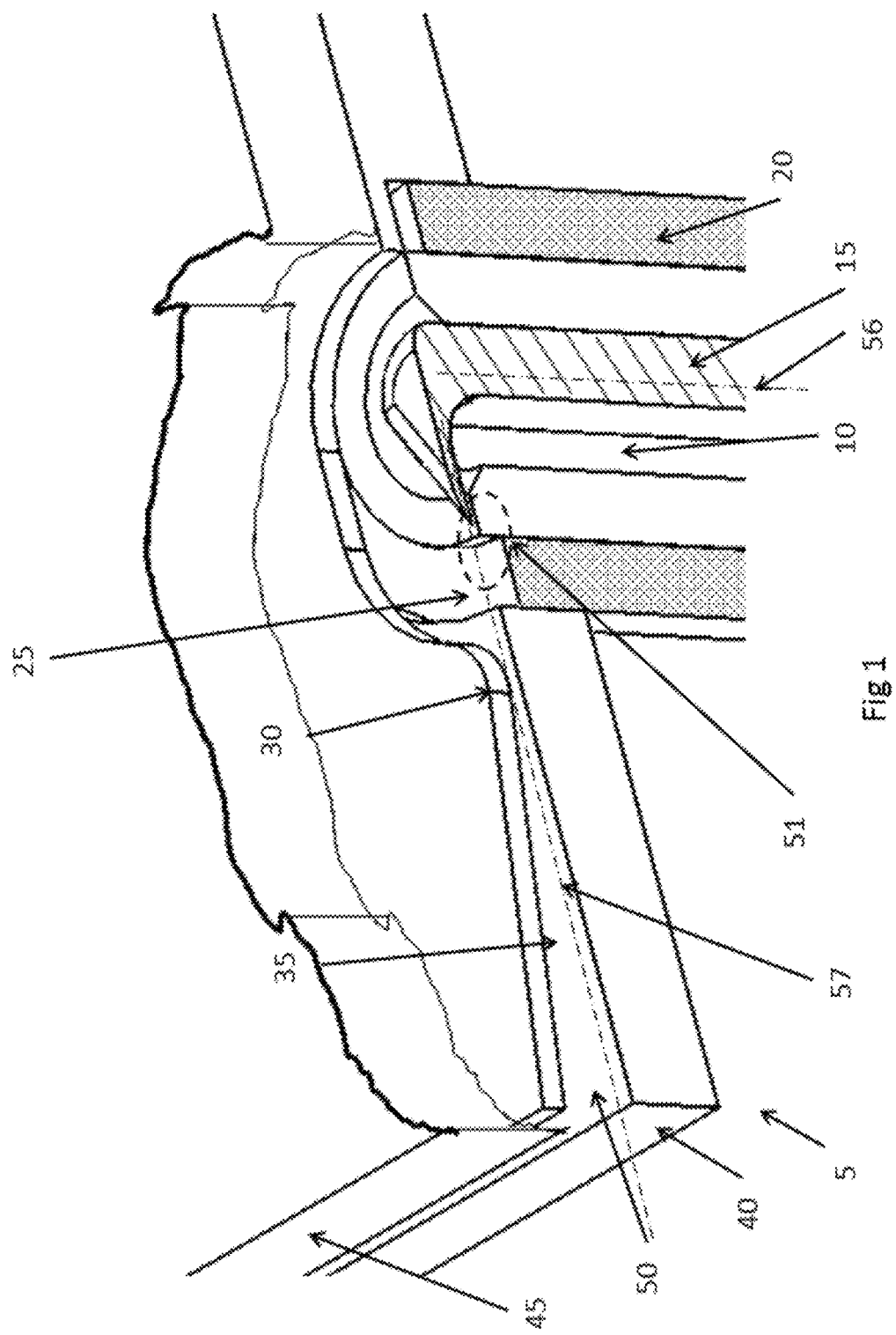
FIG. 1 is a detail view of the micro-nozzle thruster according to one embodiment of the present invention.
Figure 2A:
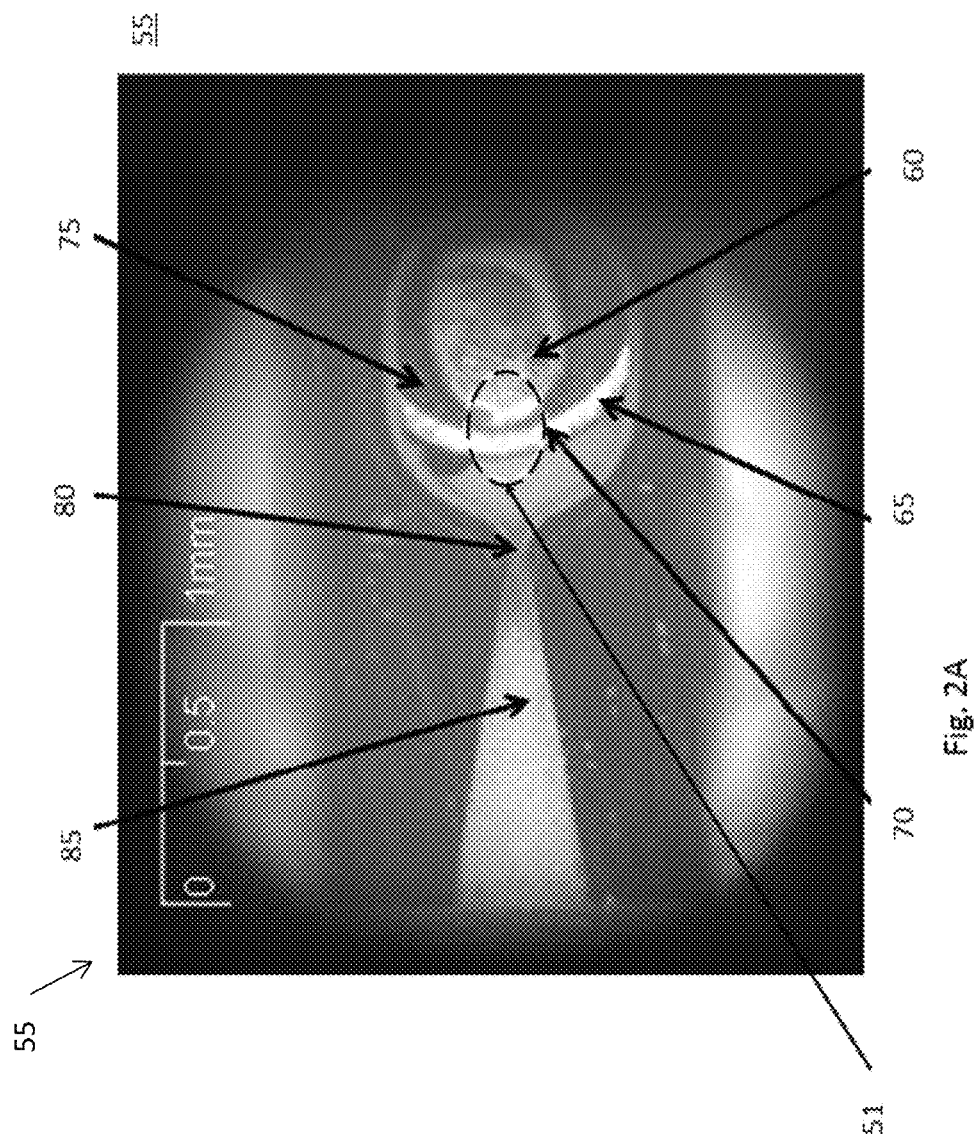
FIGS. 2A and 2B are plan views of the micro-nozzle thruster according to a further embodiment of the present invention.
Figure 2B:
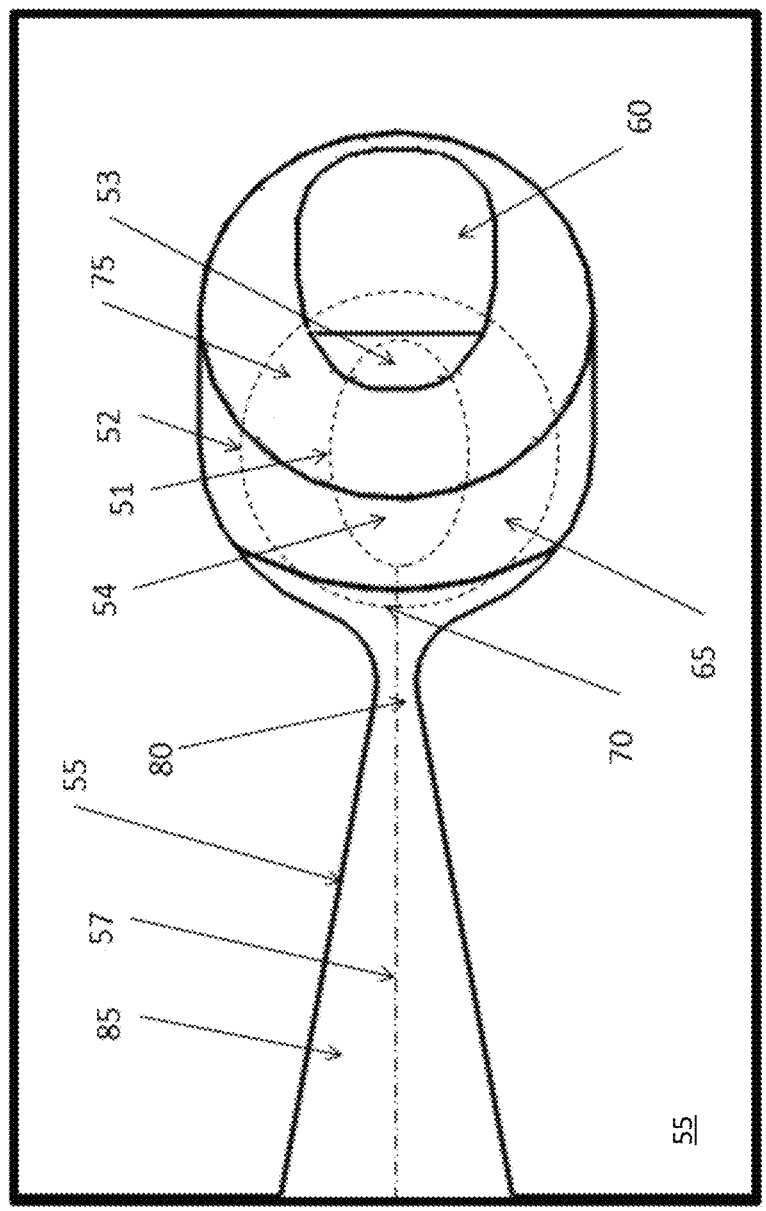
Figure 3B:
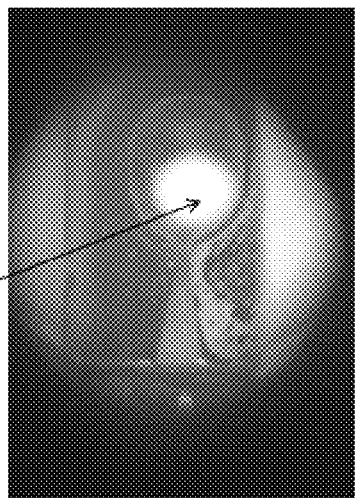
Figure 3D:
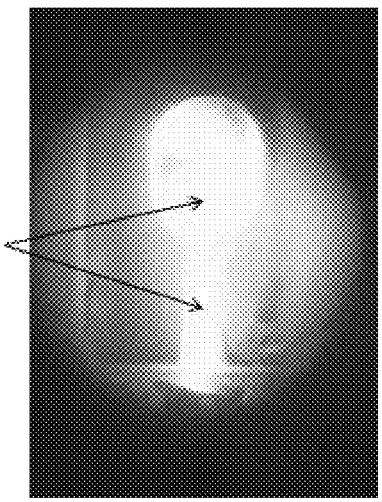
Figure 3A:
Figure 3C:
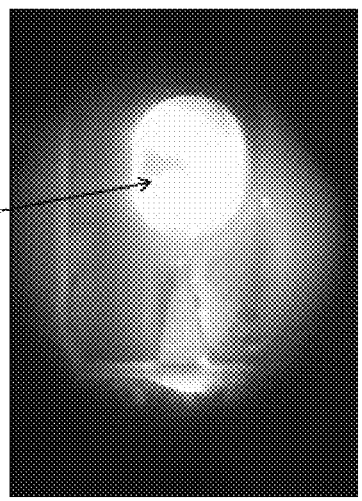

In describing the invention, an embodiment is shown in FIG. 1. The invention is directed to miniaturized arcjets 5 which uses the following basic elements:

1. a generally prismatic micro-nozzle 35 which may be micro-machined using techniques such as micro-lithography, Deep Reactive Ion Etching, Anodic Bonding and Dicing using substrates 40, 45, such as silicon and glass with inlet 25 in the central area of the substrate and outlet, or exit 50, on one of the sides.
2. A gas supply channel 10 made of substrates of insulating material such as ceramic or glass reaching the nozzle inlet perpendicularly to the substrate in correspondence of a through hole micro-machined in one or both the substrate(s).
3. An anode element 20 placed externally to the gas supply channel, but internally to the nozzle inlet 25, possibly in the form of an electrically conducting ring 65 (as shown in FIGS. 2A and 2B) and oriented between the channel and the nozzle throat 30;
4. A cathode element 15 placed internally to the gas supply channel 10, possibly in the form of an electrically conductive tip.

Alternatively, the whole nozzle can be made of conductive substrate such as doped silicon and therefore used as electrode, possibly as anode.

The configuration of cathode internal to anode may be reversed by switching electrical polarity between the two elements. Multiple anodes and cathodes may also be used.

FIGS. 2A and 2B show plan views of an actual micro-nozzle 55 having the gas supply channel 75 having a cathode 60 and anode 65 located proximate to the inlet 70. The cathode 60 and anode 65 have respective spark-generating portions 53 and 54 which define the arc discharge area 51. The subsequently formed plasma then passes through the throat 80 of the micro-nozzle and through the convergent-divergent micro-nozzle directed to the outlet, through which the gas is supplied to the inlet. Without limiting and independently from the functionality of the invention, the gas flowing through the arc discharge region 51 between cathode 60 and anode 65 is further ionized and becomes plasma with mainly positive charge.

Furthermore, by placing a negative electrode 58 along the nozzle or a negatively polarized grid 59 outside the nozzle it is possible to further accelerate such plasma through the nozzle to obtain even higher exit speed and thruster efficiency.

Figure 4B:
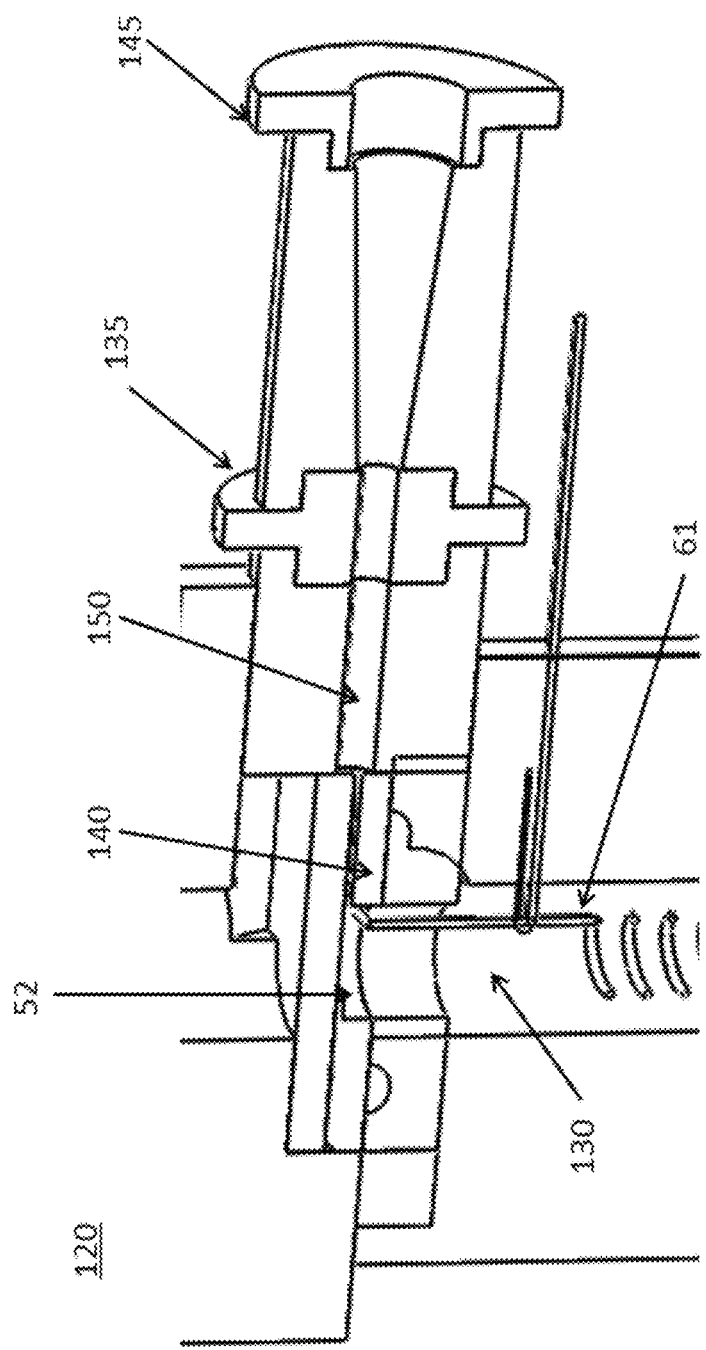

One embodiment of this arrangement is shown in FIGS. 4A and 4B. Here the micro-nozzle assembly 120 includes supply channel 130 for feeding gas to a nozzle 140. The micro-nozzle assembly includes an extension 125 having an extended nozzle channel 150 so as to pass through magnetic field source 135 and electric field source 145. Such an arrangement applies force to the plasma stream so as to maintain the stream within the bore of the nozzle 150 and so avoid heat loss and other frictional loss through contact with the nozzle faces (walls). By adding a bias voltage to the MEMS nozzle, which may be formed of silicon or by adding metallized layers, a repulsive effect to enhance ion acceleration already inside the divergent part 85 of the supersonic nozzle may be achieved. Furthermore, by adding a screen and acceleration grids outside the nozzle we can create an "electro-dynamic-after-burner" where the plasma already accelerated in the nozzle can be further electro-statically accelerated to reach very high specific impulses.

While miniaturization is a clear trend in satellites and spacecraft design, the use of micro-propulsion systems has not been very diffused both for the difficulty to find suitable systems and the practical way to provide basic attitude control by other methods such as reaction wheels and magnetorquers.

Figure 5B:
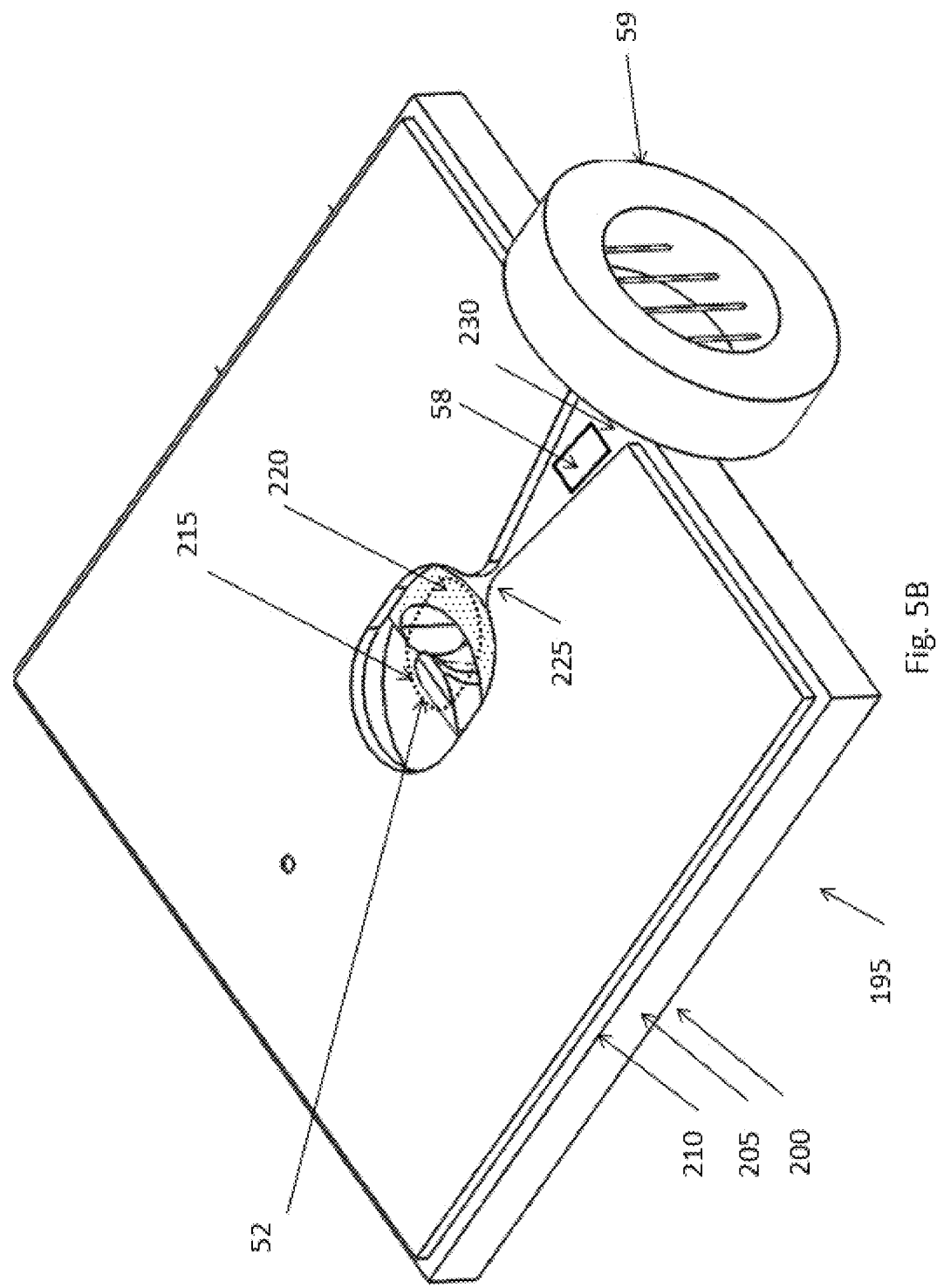
Figure 6:
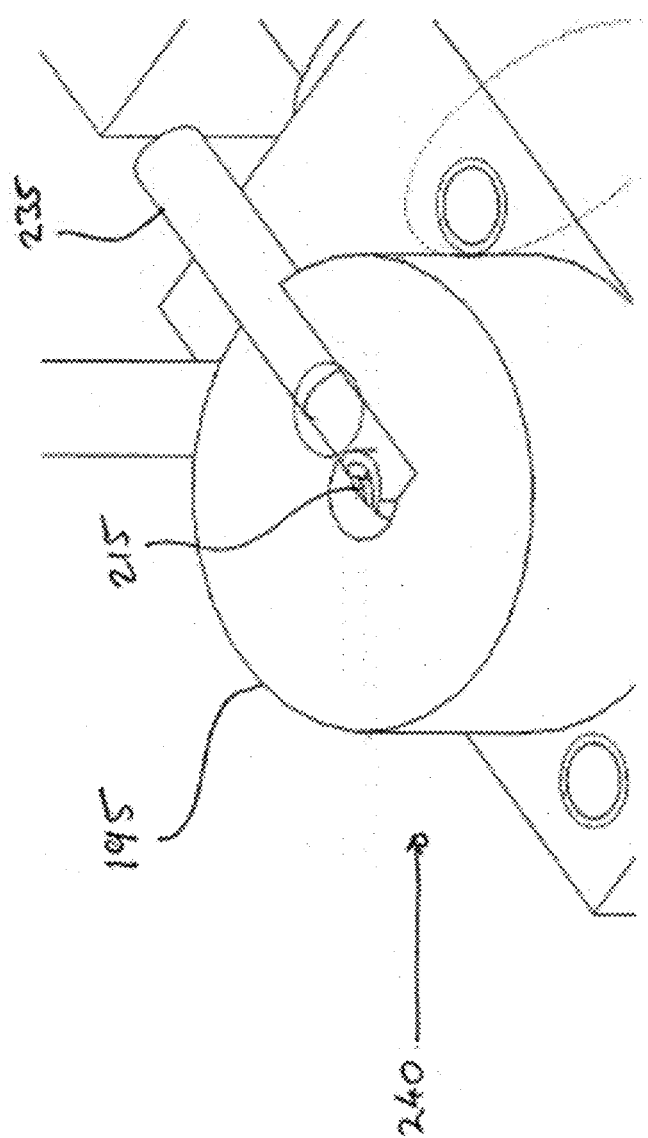
FIG. 6 is an isometric view of the inlet area of a micro-nozzle thruster assembly according to a further embodiment of the present invention.

FIGS. 5A, 5B and 6 show detailed views of a further embodiment of the present invention. Here a micro-nozzle assembly 195 is mounted to a thruster body 240. The micro-nozzle, having an inlet, throat 225 and outlet 230 is formed from a series of substrates 200, 205, 210. The micro-nozzle is positioned along an axis at right angles to a gas supply channel, with a cathode 215 within the gas supply channel and an anode 220 external to the channel but intermediate the channel and the micro-nozzle. The gas supply channel comprises a first longitudinal axis 56 and the micro-nozzle comprises a second longitudinal axis 57, wherein the first longitudinal axis is perpendicular the second longitudinal axis. In this particular configuration the anode 220 is realized from a conductive rod 235 extended from the side of the assembly.

Figure 7:
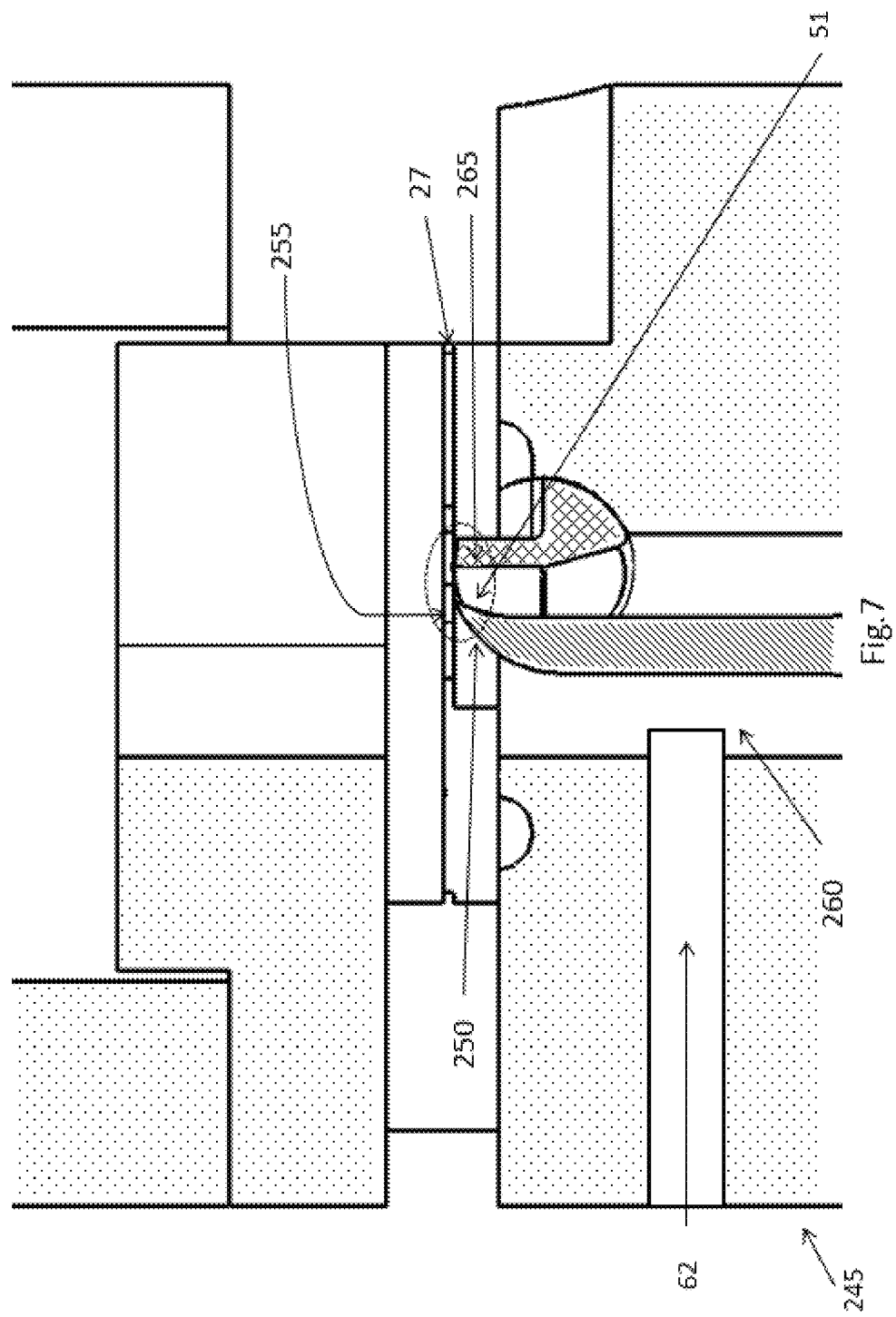
FIG. 7 is a sectional elevation view of the micro-nozzle thruster according to a further embodiment of the present invention.

The relationship between the components can be better illustrated from the sectional elevation view shown in FIG. 7. Here the micro-nozzle assembly 245 includes the gas supply channel 260 terminating at the inlet 255 of the micro-nozzle 27. A cathode 250 is located within the channel, with a tip of the cathode proximate to the inlet 255. An anode 265 is further positioned proximate to the inlet 255 so as to create a plasma flow from the gas within an arc discharge area 51 at the inlet.

Figure 9:
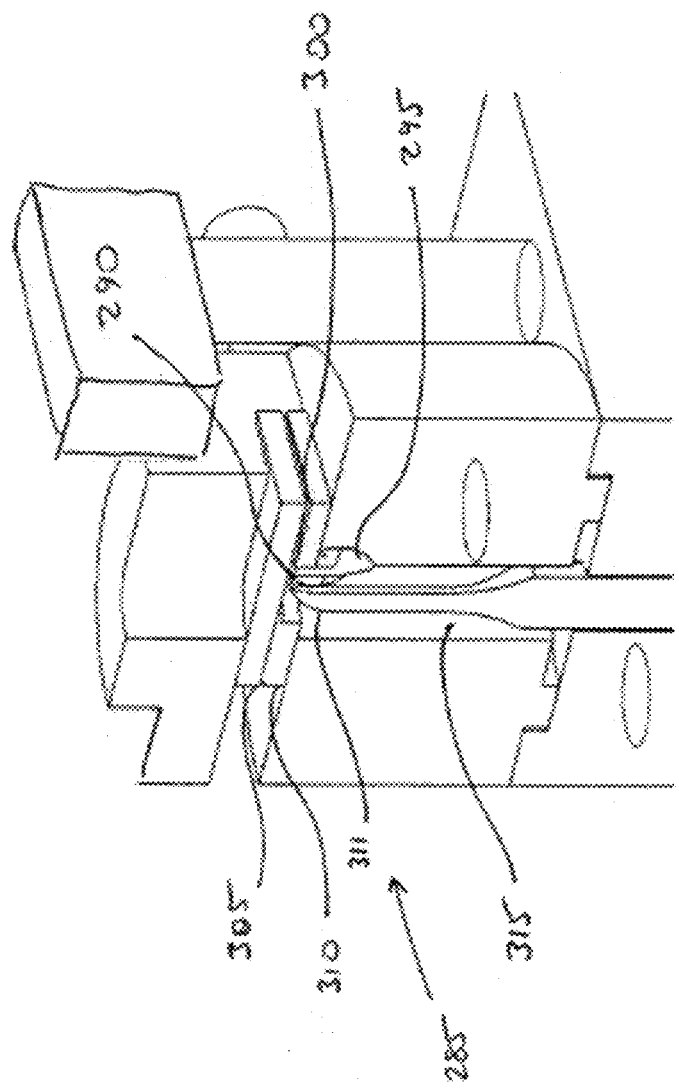
FIG. 9 is a sectional isometric view of the micro-nozzle thruster according to a further embodiment of the present invention.
Figure 10:
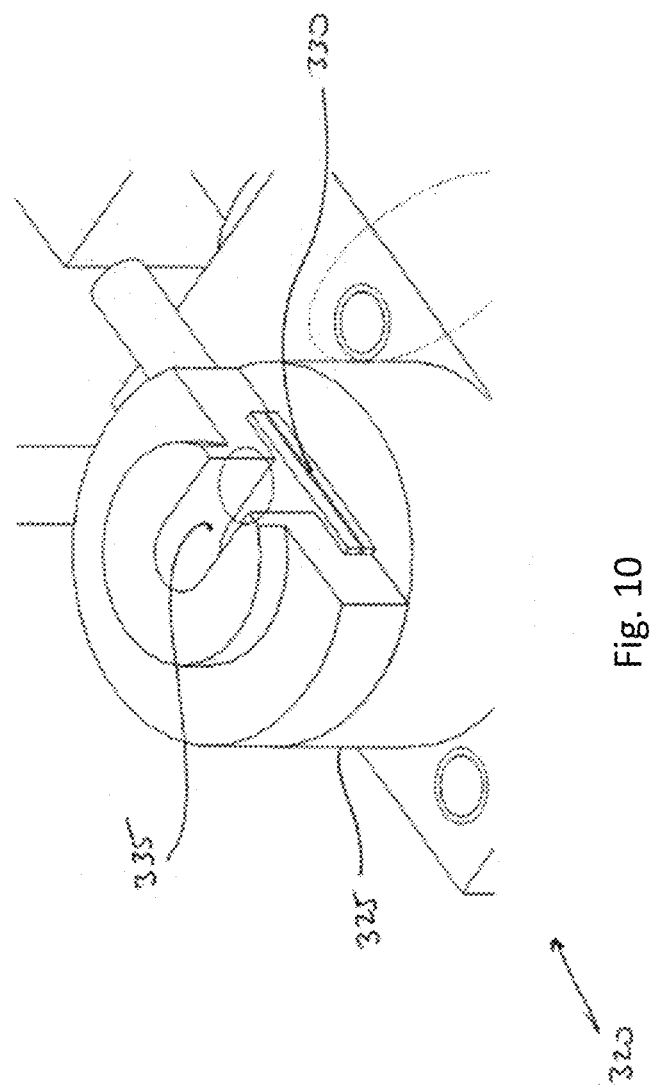
FIG. 10 is an isometric view of the micro-nozzle thruster according to a further embodiment of the present invention.

Different orientations of the micro-nozzle assembly 285, 320 are shown in FIGS. 9 and 10. In FIG. 9, the micro-nozzle is formed from substrates 305, 310 into which the gas supply channel 315 directs gas. A cathode 311 within the channel is positioned with a cathode tip 290 proximate the anode 295 for converting the gas flow to plasma, for final ejection through outlet 300.

FIG. 10 shows a micro-nozzle assembly 325 mounted to a thruster 320, with the outlet 330 providing the ejection of plasma for the requisite propulsion where the upper element 335 is encapsulating the micro-nozzle for thermal insulation purposes.

Figure 8:
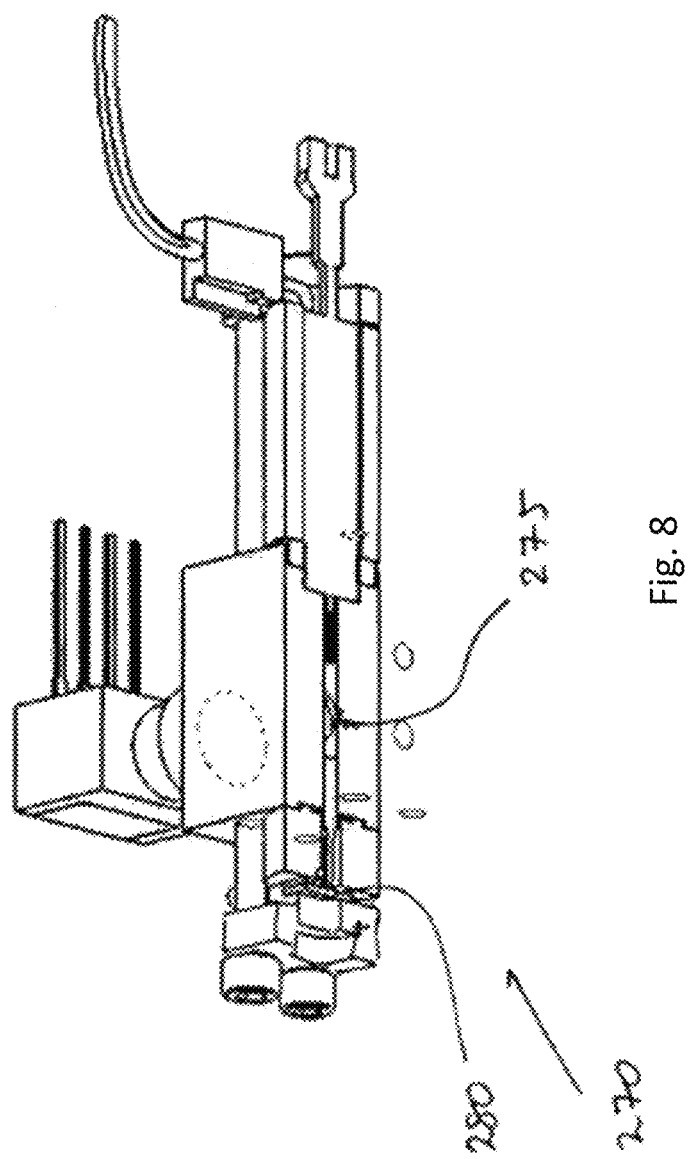
FIG. 8 is an isometric view of micro-nozzle thruster assembly according to a further embodiment of the present invention.

FIG. 8 shows an further embodiment of the micro-nozzle assembly 270 which includes a micro-valve and a pressure sensor and has the nozzle 280 sandwiched between the thruster body 275 and a lid for easy assembly and replacement. The embodiment using a Cold-Gas configuration may be enhanced by adding a pre-heater section used as warm-gas or vaporizing unit depending on the choice of propellant. The same section may be further improved to become a micro-arcjet module to further increase the gas temperature before nozzle expansion and possibly initiate the ionization. In a further embodiment, a double flow unit that can pre-mix two species before entering the heating section 52 is possible. This is used as colloid thruster or to achieve heating by the reaction of the two species such as in bipropellant thrusters. In the Cold-Gas version and for low temperature Resistojet the nozzle is sealed to the thruster body with a Viton O-ring, while for the high temperature versions it is sealed with $ZrO_2$ ceramic bond that can withstand over 3000° C.

Embodiments of the Cold-Gas and Resistojet may have attended values of nominal thrust (i.e. 1 mN+/−20 μN) and the expected values of specific impulse reaching more than 50 s for the Cold-Gas and up to 120 s for the Resistojet. The resistojet has been successfully tested as vaporizing thruster with various liquids thereby confirming the potential of very high Δv.

Gas ionization may be achieved by means of a sustained spark in the nozzle area. Given the small size of the electrode gap in the arc-jet augmentation module, reasonably low voltages are expected to be necessary. In fact sustaining glow discharges can be achieved with as low as 200V to 400V and 0.1 mA to 8 mA for Argon at atmospheric pressure on micro-hollow cathode arrangements with holes varying from 200 μm to 1000 μm.

The sustained arc discharge will produce the heating of the propellant gas with beneficial effect on the specific impulse and the ionization of the gas which will be then exploited by the acceleration potential to further increase the specific impulse. Typical spark temperature can be between 3000K and 5000K.

The invention may be illustrated in FIGS. 3A to 3D and FIGS. 3E to 3H, which show a sequential view of arc ignition inside a micro-nozzle 90 assembled according to the ArcJet configuration. The chosen micro-nozzle 90 has 50 m×100 m of throat cross section for 10 mN of nominal thrust at 6 bar supply of Nitrogen in Cold-Gas configuration. While $N_2$ was supplied at 3 bar with exhaust in atmosphere (1 bar), ignition 100, 105, 115 of the arc has happened at about 1000V with stainless steel electrodes with 200 m gap; current was limited at 30 mA with the power supply available for the experiment arid it stabilized around 15 mA during stable sustained arc. Given the high intensity of the arc, we expect to be able to keep it stable at current in the order of 5 mA to 10 mA and with a more precise and optimised electrode configuration we expect to be able to work at about 500V therefore keeping the arc power in the order of 5 W and the total power requirements below 10 W with a minimum power supply efficiency of 50%.

The degree of ionization ξ dependence on the temperature is described by the Saha-Eggert law:

$$\xi = \frac{n_-}{n_0} = \sqrt{\frac{\left(\frac{2\pi k}{h^2}\right)^{\frac{3}{2}} T^{\frac{3}{2}} e^{-\frac{U_i s_i}{kT}}}{n_0}}$$

Which, if $n_0$ is calculated from pressure and temperature with the ideal gas law, can be plot in the practical range of interest for micro-propulsion devices (p<10 bar, T<20000K).

A modest, but sufficient degree of ionization can be expected, in the order of 1E-6 to 1E-5, which corresponds to a plasma density $n_i$=6E17 to 6E18 ions per cubic meter, comparable or in excess of what obtained in miniaturized ion thrusters at JPL (48). Further acceleration and focusing of the ionized flow is achieved by means of voltage applied to the shield and accelerator grid placed outside the supersonic nozzle.

For the ion acceleration preliminary design, the voltage variation along the nozzle will be obtained by the mono-dimensional integration of the equation of energy conservation and second Maxwell equation:

$$\frac{1}{2}mu^2 + q\phi_x = \text{const} = \frac{1}{2}mu_A^2 + q\phi_A$$

$$\frac{d^2\phi}{dx^2} = -\frac{n_i q}{\epsilon_0}$$

Which rearranged will give the ideal performance of the electrostatic thruster (24):

$$I_{sp} = \frac{u_c}{a_0} = \frac{1}{a_0}\sqrt{2\frac{q}{m}(\phi_A - \phi_C)}$$

One further aspect to be considered will be the neutralization of the ionized beam ejected by the thruster. This will be achieved by a second cathode emitter placed in proximity of the nozzle exit.

The micro-nozzles may be manufactured by Deep-Reactive Ion Etching (D-RIE) on 4 or 8 inch silicon wafers, patterned by UV-lithography, anodically bonded on borosilicate glass and precisely diced with diamond saw. Such process guarantees profile and depth tolerances as low as 1 μm for optimal reproducibility of nozzle performances and efficiency.

Figure 11:
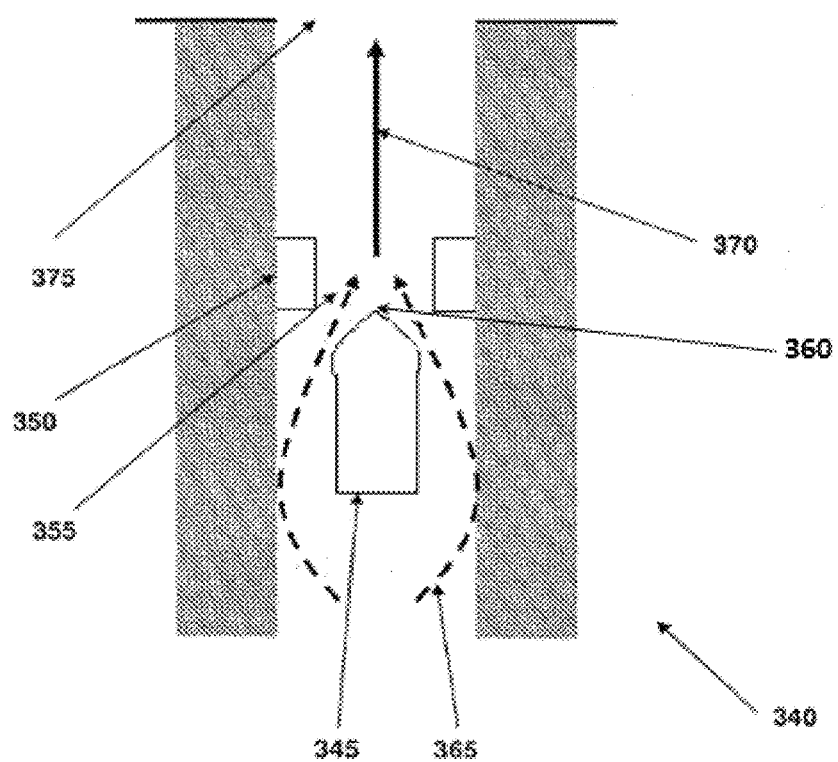
FIG. 11 is a sectional elevation view of a co-axial micro-nozzle assembly according to the present invention.

FIG. 11 shows an alternative micro-nozzle assembly 340 having a gas supply channel co-axially arranged with the micro-nozzle, so as to provide a greater gas supply, and consequently a greater plasma flow. As with the perpendicularly arranged micro-nozzle assembly, a cathode 345 is provided within the gas supply channel, having a cathode tip 360 proximate to an anode 350, which together define an arc discharge zone 51 at the inlet 355 of the micro-nozzle. The formed plasma 370 is then ejected from the micro-nozzle through the outlet 375.

The micro-nozzle assembly 340 of FIG. 11 may therefore be used cooperatively with the assembly 325 of FIG. 10 through coarse adjustment from the co-axial assembly and fine adjustment from the perpendicularly arranged assembly of FIG. 10.

The invention claimed is:

1. A micro-nozzle thruster comprising:
   a heating section;
   a gas supply channel having a longitudinal axis, wherein the gas supply channel is configured to supply a gas to the heating section;
   a planar substrate defined by a plane, wherein the plane is perpendicular to the longitudinal axis, the planar substrate having a micro-nozzle formed therein, wherein the micro-nozzle is downstream of the gas supply channel, the micro-nozzle having an inlet and a thruster outlet;
   a first electrode having a spark generating portion disposed in the gas supply channel; and a second electrode having a spark generating portion disposed external to the gas supply channel and intermediate the gas supply channel and the micro-nozzle, the spark generating portion of the first electrode and the spark generating portion of the second electrode defining therebetween an arc discharge region configured to create a plasma flow from the gas; wherein the micro-nozzle thruster is configured to flow the plasma flow from the arc discharge region to the inlet of the micro-nozzle, and for the plasma flow to provide thrust force from the thruster outlet of the micro-nozzle.

2. The micro-nozzle thruster of claim 1, wherein the micro-nozzle is prismatic.

3. The micro-nozzle thruster of claim 2, wherein the micro-nozzle is micro-machined using any one or a combination of: micro-lithography, Deep Reactive Ion Etching, Anodic Bonding and Dicing, and wherein the micro-nozzle thruster is comprised of substrates.

4. The micro-nozzle thruster of claim 1, further comprising a third electrode disposed along the micro-nozzle for accelerating the plasma flow through the micro-nozzle.

5. The micro-nozzle thruster of claim 1, further comprising a negatively polarised grid disposed external to the micro-nozzle for accelerating the plasma flow through the micro-nozzle.

6. The micro-nozzle thruster of claim 1, wherein the second electrode comprises an electrically conducting ring.

7. The micro-nozzle thruster of claim 1, wherein the first electrode is disposed proximate to the inlet.

8. The micro-nozzle thruster of claim 1, further comprising a resistor for pre-heating gas in the gas supply channel.

9. The micro-nozzle thruster of claim 1, further comprising a resistor for pre-heating the first electrode.

10. The micro-nozzle thruster of claim 1, further comprising a magnetic field source for generating a magnetic field within the micro-nozzle for magnetic confinement of the plasma flow in a central portion of the micro-nozzle.

11. The micro-nozzle thruster of claim 10, wherein the magnetic field source comprises permanent magnets or coils disposed external to the micro-nozzle.

12. The micro-nozzle thruster of claim 11, further comprising an electric field source for generating an electric field transverse to the longitudinal axis of the micro-nozzle.

13. The micro-nozzle thruster of claim 12, wherein the electric field source comprises electrodes disposed within faces of the micro-nozzle.

14. The micro-nozzle thruster of claim 1, further comprising a particle supply configured for solid particles to be injected.

15. The micro-nozzle thruster of claim 1, wherein the gas supply channel is made of substrates of insulating material.

16. A method of operating a micro-nozzle thruster according to claim 1, the method comprising:
   supplying the gas along the gas supply channel to the heating section;
   passing the gas between the spark generating portion of the first electrode and the spark generating portion of the second electrode,
   creating the plasma flow from the gas in the arc discharge region;
   directing the plasma flow from the arc discharge region to the inlet of the micro-nozzle; and
   ejecting the plasma flow from the thruster outlet of the micro-nozzle to provide thrust force.

* * * * *